(12) United States Patent
Jeong et al.

(10) Patent No.: US 11,152,444 B2
(45) Date of Patent: Oct. 19, 2021

(54) DISPLAY PANEL AND DISPLAY DEVICE COMPRISING CAPACITOR WITH INCREASED CAPACITANCE

(71) Applicant: LG Display Co., Ltd., Seoul (KR)

(72) Inventors: Mijin Jeong, Paju-si (KR); JaeHyun Kim, Paju-si (KR); DeukHo Yeon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 6 days.

(21) Appl. No.: 16/528,270

(22) Filed: Jul. 31, 2019

(65) Prior Publication Data

US 2020/0119122 A1 Apr. 16, 2020

(30) Foreign Application Priority Data

Oct. 15, 2018 (KR) .......................... 10-2018-0122373

(51) Int. Cl.
*H01L 27/32* (2006.01)
(52) U.S. Cl.
CPC ...... *H01L 27/3265* (2013.01); *H01L 27/3276* (2013.01)

(58) Field of Classification Search
None
See application file for complete search history.

(56) References Cited

U.S. PATENT DOCUMENTS

2013/0309819 A1* 11/2013 Lee .................. G02F 1/136213
438/155
2016/0372497 A1* 12/2016 Lee ..................... H01L 27/1222

* cited by examiner

*Primary Examiner* — Daniel Whalen
(74) *Attorney, Agent, or Firm* — Fenwick & West LLP

(57) ABSTRACT

A display panel and a display device includes a high-permittivity material disposed between electrodes of capacitor disposed in a subpixel. This increases the capacitance per area of the capacitor, such that a high-resolution display device is provided. A high-permittivity material is disposed in the insulating layer, and the surface of the insulating layer is planarized by polishing. The high-permittivity material is prevented from residing in any area, except for the area in which the capacitor is disposed. An unnecessary increase in load in the subpixel is prevented, and the capacitance of the capacitor is increased.

24 Claims, 19 Drawing Sheets

FIG.17

| SiNx Permittivity | 7.5 |
|---|---|
| SiO2 Permittivity | 3.9 |

| Classification | INS1 | | INS2 | | Electrode Area Ratio | Cap. Ratio (%) |
|---|---|---|---|---|---|---|
| | Film Type | Thickness(Å) | Film Type | Thickness (Å) | | |
| Ref | SiO2 | 3000 | SiO2 | 1400 | 1 | 100 |
| Example1A | SiNx | 3000 | SiO2 | 1400 | 1 | 148 |
| Example2A | SiNx | 3000 | SiNx | 1850 | 1 | 174 |
| Example1B | SiNx | 3000 | SiO2 | 1400 | 0.673 | 100 |
| Example2B | SiNx | 3000 | SiNx | 1850 | 0.573 | 100 |

DISPLAY PANEL AND DISPLAY DEVICE COMPRISING CAPACITOR WITH INCREASED CAPACITANCE

CROSS REFERENCE TO RELATED APPLICATION

This application claims priority to Republic of Korea Patent Application No. 10-2018-0122373, filed on Oct. 15, 2018, which is incorporated herein by reference in its entirety.

BACKGROUND

Field

Exemplary embodiments relate to a display panel and a display device.

Description of Related Art

With the development of the information society, there has been an increasing demand for image display devices. In this regard, a range of display devices, such as liquid crystal display (LCD) devices, and organic light-emitting display devices, have recently come into widespread use.

Among such display devices, organic light-emitting display devices provide advantageous features regarding response speed, contrast ratio, luminous efficiency, luminance, and viewing angle, since organic light-emitting diodes (OLEDs), i.e. self-emissive devices, are used.

Each of a plurality of subpixels disposed in such an organic light-emitting display device may include an organic light-emitting diode and a variety of circuit elements driving the organic light-emitting diode.

For example, in each of the subpixels, an organic light-emitting diode, a driving transistor controlling current flowing through the organic light-emitting diode, and a variety of transistors controlling various types of timing and voltage applications may be disposed. In addition, a capacitor maintaining a voltage of a gate electrode of the driving transistor for a one-frame period may be disposed in each of the subpixels.

The capacitor disposed in each of the subpixels occupies a predetermined area in the subpixel. Since the area of the subpixel is further reduced with increases in the resolution of the organic light-emitting display device, there are many difficulties in disposing the capacitor within the subpixel.

BRIEF SUMMARY

Various aspects of the present disclosure provide a display panel and a display device having a structure able to increase the capacitance per area of a capacitor disposed in each of subpixels arrayed in a display panel.

Also provided are a display panel and a display device having a structure able to maintain the capacitance of the capacitor disposed in the subpixel at a predetermined level and reduce the area of the capacitor, thereby supporting high resolution.

Also provided are a display panel and a display device having a structure able to increase the capacitance per area of the capacitor disposed in the subpixel and prevent an increase in load in any area, except for an area in which the capacitor is disposed.

According to an aspect, exemplary embodiments may provide a display device including: a display panel in which a plurality of gate lines, a plurality of data lines, and a plurality of subpixels are disposed; a gate driver circuit driving the plurality of gate lines; and a data driver circuit driving the plurality of data lines. At least one of the plurality of subpixels includes: a first capacitor electrode; a first insulating layer disposed on the first capacitor electrode; an active layer disposed on a portion of the first insulating layer; a second insulating layer disposed on the first insulating layer and the active layer; and a second capacitor electrode disposed on the second insulating layer, the second capacitor electrode overlapping the first capacitor electrode in an area.

In the display device, a first portion of the first insulating layer or of the second insulating layer has a first permittivity, and a second portion of the first insulating layer or of the second insulating layer has a second permittivity, the second portion overlapping a part of the area in which the first capacitor electrode and the second capacitor electrode overlap each other. The second permittivity is higher than the first permittivity.

According to another aspect, exemplary embodiments may provide a display device including: a display panel in which a plurality of gate lines, a plurality of data lines, and a plurality of subpixels are disposed; a gate driver circuit driving the plurality of gate lines; and a data driver circuit driving the plurality of data lines, wherein at least one of the plurality of subpixels includes an organic light-emitting diode, a driving transistor driving the organic light-emitting diode, and a capacitor connected to a gate node of the driving transistor, and wherein at least a portion of an insulating layer disposed between electrodes of the capacitor has a higher permittivity than another portion of the insulating layer disposed on the same layer.

According to another aspect, exemplary embodiments may provide a display panel including: a substrate; a polyimide layer disposed on the substrate; a buffer layer disposed on the polyimide layer; a first capacitor electrode disposed on the buffer layer; a first insulating layer disposed on the first capacitor electrode; an active layer disposed in a portion of the first insulating layer; a second insulating layer disposed on the first insulating layer and the active layer; and a second capacitor electrode disposed on the second insulating layer, wherein the second capacitor electrode overlaps the first capacitor electrode in an area. A first portion of the first insulating layer or of the second insulating layer may have a first permittivity, a second portion of the first insulating layer or of the second insulating has a second permittivity, the second portion overlapping a part of the area in which the first capacitor electrode and the second capacitor electrode overlap each other, and the second permittivity is higher than the first permittivity.

According to exemplary embodiments, at least a portion of the insulating layer disposed between the electrodes of the capacitor is made of a high-permittivity material, such that the capacitance per area of the capacitor is increased.

Accordingly, a high-resolution display panel and device can be provided by ensuring that the area of the capacitor disposed in the subpixel is reduced while the capacity of the capacitor is maintained at a predetermined level.

In addition, a portion of the insulating layer between the electrodes of the capacitor is made of the high-permittivity material, with the surface of the insulating layer being planarized using a thin film polishing operation. Accordingly, a high-permittivity material is removed from areas, except for the area between the electrodes of the capacitor, such that the capacitance of the capacitor can be increased.

According to some embodiments, a display device comprises a display panel including a plurality of subpixels, each configured to emit light. At least one of the plurality of subpixels includes a capacitor. The capacitor includes a first electrode, one or more insulating layers having a first permittivity and disposed on the first electrode, an active layer, and a second electrode on the one or more insulating layers and the active layer. The active layer is disposed in between the first electrode and the second electrode, and the second electrode overlaps the first electrode and the active layer.

According to some embodiments, the display device also includes one or more insulating parts having a second permittivity and disposed between the first electrode and the second electrode. The second permittivity is greater than the first permittivity.

According to some embodiments, the active layer is positioned in a first portion of the capacitor, and the one or more insulating parts are positioned in a second portion of the capacitor separate from the first portion of the capacitor.

According to some embodiments, the one or more insulating parts includes a first insulating part and a second insulating part, on opposite sides of the one or more insulating layers.

According to some embodiments, the one or more insulating layers include at least a lower insulating layer and an upper insulating layer on the lower insulating layer.

According to some embodiments, the active layer is between the lower insulating layer and the upper insulating layer.

According to some embodiments, the upper insulating layer is on the one or more insulating parts and the active layer.

According to some embodiments, the one or more insulating parts are on the lower insulating layer.

According to some embodiments, a top surface of the one or more insulating layers is at a same height as a top surface of the one or more insulating parts.

According to some embodiments, the capacitor also includes another insulating part on the second electrode. The another insulating part has a third permittivity higher than the first permittivity. The capacitor includes a third electrode on the another insulating part, and the third electrode overlaps the second electrode.

According to some embodiments, the at least one of the plurality of subpixels also includes a transistor, and a part of the active layer is a channel of the transistor.

BRIEF DESCRIPTION OF THE DRAWINGS

The above and other objects, features, and advantages of the present disclosure will be more clearly understood from the following detailed description when taken in conjunction with the accompanying drawings.

FIG. 17 illustrates variations in the capacitance of the capacitor in the subpixel provided according to exemplary embodiments.

DETAILED DESCRIPTION

Figure 1:
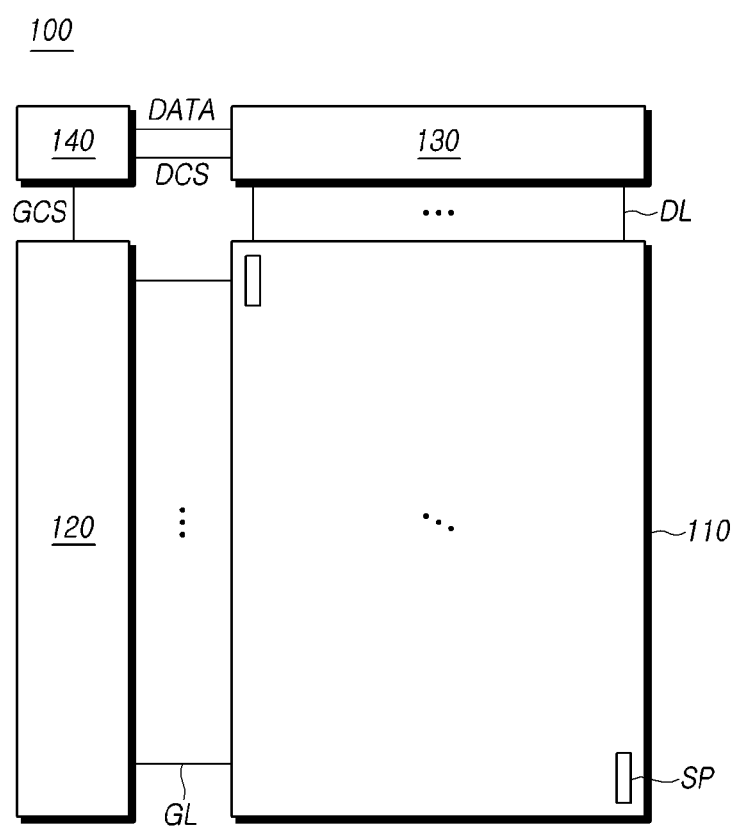
FIG. 1 illustrates a schematic configuration of a display device according to exemplary embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated into the present disclosure will be omitted in the case that the subject matter of the present disclosure may be rendered unclear thereby.

It will also be understood that, while terms, such as "first," "second," "A," "B," "(a)," and "(b)," may be used herein to describe various elements, such terms are merely used to distinguish one element from other elements. The substance, sequence, order, or number of such elements is not limited by these terms. It will be understood that when an element is referred to as being "connected," "coupled," or "linked" to another element, not only can it be "directly connected, coupled, or linked" to the other element, but it can also be "indirectly connected, coupled, or linked" to the other element via an "intervening" element.

FIG. 1 illustrates a schematic configuration of a display device 100 according to exemplary embodiments.

Referring to FIG. 1, the display device 100 according to exemplary embodiments may include a display panel 110 in which a plurality of subpixels SP, each respectively including a light-emitting element, are arrayed, as well as components for driving the display panel 110, such as a gate driver circuit 120, a data driver circuit 130, and a controller 140.

In the display panel 110, a plurality of gate lines GL and a plurality of data lines DL are disposed, and a plurality of subpixels SP are disposed in areas in which the plurality of gate lines GL intersect the plurality of data lines DL. Each of the plurality of subpixels SP may include a light-emitting element, and two or more subpixels SP may form a single pixel.

The gate driver circuit 120 is controlled by the controller 140 to sequentially output a scanning signal to the plurality of gate lines GL, disposed in the display panel 110, thereby controlling points in time at which the plurality of subpixels SP are driven. In addition, the gate driver circuit 120 may output an emission signal to control emission times of the light-emitting elements in the subpixels SP. The circuit outputting the scanning signal and the circuit outputting the emission signal may be provided integrally or separately.

The gate driver circuit 120 may include one or more gate driver integrated circuits (ICs). The gate driver circuit 120 may be disposed on one side or both sides of the display panel 110, depending on the driving system. In addition, the gate driver circuit 120 may be implemented using a gate-in-panel (GIP) structure disposed in the bezel of the display panel 110.

The data driver circuit 130 receives image data from the controller 140 and converts the image data into an analog data voltage. In addition, the data driver circuit 130 outputs the data voltage to the data lines DL, respectively, at points in time at which the scanning signal is applied through the gate lines GL, so that the subpixels SP represent brightness levels corresponding to the image data.

The data driver circuit 130 may include one or more source driver ICs.

The controller 140 supplies a variety of control signals to the gate driver circuit 120 and the data driver circuit 130 to control the operations of the gate driver circuit 120 and the data driver circuit 130.

The controller 140 controls the gate driver circuit 120 to output the scanning signal at points in time defined by frames. The controller 140 converts image data, received from an external source, into a data signal format readable by the data driver circuit 130, and outputs the converted image data to the data driver circuit 130.

The controller 140 receives a variety of timing signals, including a vertical synchronization signal Vsync, a horizontal synchronization signal Hsync, an input data enable (DE) signal, a clock (CLK) signal, and the like, in addition to the image data, from an external source (e.g. a host system).

The controller 140 may generate a variety of control signals using the variety of timing signals received from the external source and output the control signals to the gate driver circuit 120 and the data driver circuit 130.

For example, the controller 140 outputs a variety of gate control signals GCS, including a gate start pulse (GSP) signal, a gate shift clock (GSC) signal, a gate output enable (GOE) signal, and the like, to control the gate driver circuit 120.

Here, the gate start pulse signal controls the operation start time of the one or more gate driver ICs of the gate circuit 120. The gate shift clock is a clock signal commonly input to the one or more gate driver ICs to control the shift time of the scanning signal. The gate output enable signal designates timing information of the one or more gate driver ICs.

In addition, the controller 140 outputs a variety of data control signals DCS, including a source start pulse (SSP) signal, a source sampling clock (SSC), a source output enable (SOE) signal, and the like, to control the data driver circuit 130.

Here, the source start pulse signal controls the data sampling start time of the one or more source driver ICs of the data driver circuit 130. The source start pulse signal is a clock signal controlling the sampling time of data in each of the source driver ICs. The source output enable signal controls the output time of the data driver circuit 130.

The display device 100 may further include a power management integrated circuit (PMIC) to supply various forms of voltage or current to the display panel 110, the gate driver circuit 120, the data driver circuit 130, and the like, or control various forms of voltage or current to be supplied to the same.

In addition, signal or voltage lines, through which a variety of signals or voltages are supplied, may be disposed in the display panel 110, in addition to the gate lines GL and the data lines DL. Each of the subpixels SP may accommodate a light-emitting element, transistors driving the light-emitting element, and the like.

Figure 2:
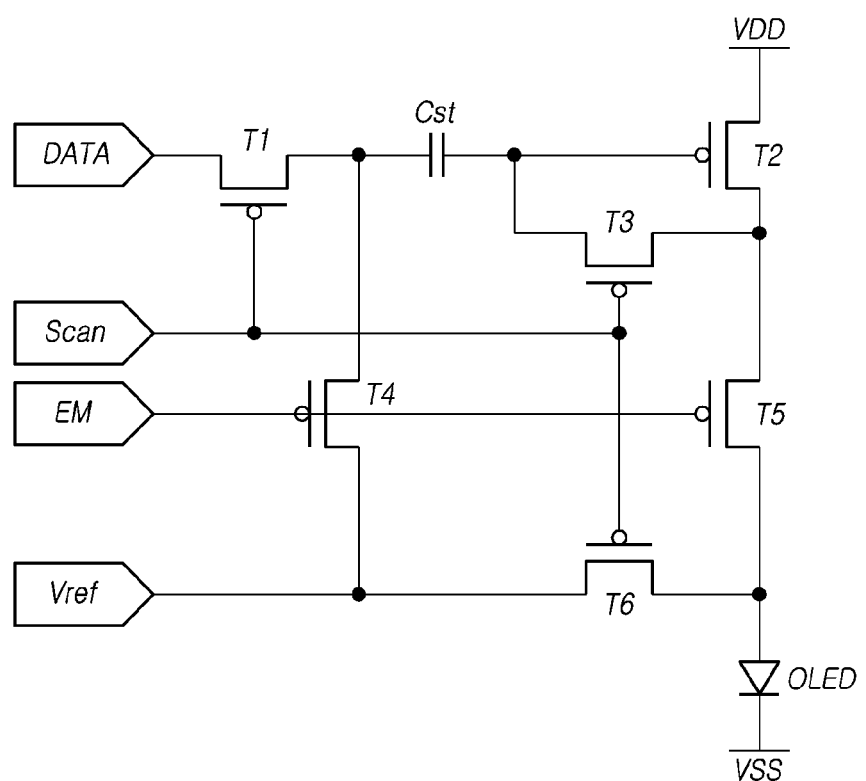
FIG. 2 illustrates a circuit diagram of the subpixel arrayed in the display panel of the display device according to exemplary embodiments.

FIG. 2 illustrates a circuit diagram of the subpixel SP arrayed in the display panel 110 of the display device 100 according to exemplary embodiments.

Referring to FIG. 2, in each of the subpixels SP arrayed in the display panel 110, an organic light-emitting diode OLED, a plurality of display driving transistors driving the organic light-emitting diode OLED, and a capacitor Cst may be disposed.

FIG. 2 illustrates a 6T1C structure in which six display driving transistors T1, T2, T3, T4, T5, and T6 and one capacitor Cst are disposed in the subpixel SP. The subpixel SP may have a variety of other structures, depending on the number or connection structure of circuit elements disposed therein.

In addition, although the display driving transistors, disposed in the subpixel SP, are illustrated as being p-type transistors, n-type display driving transistors may be disposed in the subpixel SP.

The first transistor T1 may be electrically connected between the data driver circuit 130 and the capacitor Cst, and may be controlled by a scanning signal supplied through a gate line GL.

In response to a scanning signal having a turn-on level being applied to the first transistor T1 through the gate line GL, the first transistor T1 allows the data voltage, supplied by the data driver circuit 130, to be applied to one portion of the capacitor Cst.

The second transistor T2 may be electrically connected between a line, through which a driving voltage VDD is supplied, and the fifth transistor T5. The gate electrode of the second transistor T2 may be electrically connected to the capacitor Cst.

The second transistor T2 is also referred to as a driving transistor. The second transistor T2 may control the level of brightness represented by the organic light-emitting diode OLED by controlling a current flowing through the organic light-emitting diode OLED, in response to a voltage applied to the gate electrode.

The third transistor T3 may be electrically connected between the gate electrode and the drain electrode or the gate electrode and the source electrode of the second transistor T2. In addition, the third transistor T3 may be controlled by the scanning signal supplied through the gate line GL.

The third transistor T3 is intended to compensate for the threshold voltage of the second transistor T2, and may also be referred to as a compensation transistor.

That is, the second transistor T2 is a driving transistor to control the current flowing through the organic light-emitting diode OLED in response to the data voltage applied to the subpixel SP. However, the organic light-emitting diode OLED disposed in each of the subpixels SP may not represent an intended level of brightness, due to a variation in the threshold voltage of the second transistor T2 disposed in each of the subpixels SP.

In this regard, the threshold voltage of the second transistor T2, disposed in each of the subpixels SP, is compensated for using the third transistor T3.

For example, when a scanning signal for turning the third transistor T3 on is applied through the gate line GL, a voltage, produced by deducting the threshold voltage of the second transistor T2 from the driving voltage VDD, is applied to the gate electrode of the second transistor T2.

In a state in which the driving voltage VDD, from which the threshold voltage is deducted, is applied to the gate electrode of the second transistor T2, compensation for the threshold voltage of the second transistor T2 may be performed by applying the data voltage to one portion of the capacitor Cst.

Here, the first transistor T1, controlling the application of the data voltage to one portion of the capacitor Cst, and the third transistor T3, performing compensation for the threshold voltage of the second transistor T2, may be controlled by the scanning signal supplied through the same gate line GL or the scanning signal supplied through different gate lines GL.

As described above, as the variation of the threshold voltage of the second transistor T2 is compensated for using the third transistor T3, the variation of the luminance of the subpixel SP, caused by the different threshold voltage of the second transistor T2, can be prevented.

The fourth transistor T4 may be electrically connected between the capacitor Cst and a line, through which a reference voltage Vref is supplied. In addition, the fourth transistor T4 may be controlled by an emission signal supplied through the gate line GL.

When the emission signal having a turn-on level is applied through the gate line GL, the fourth transistor 14 may initialize the voltage of one portion of the capacitor Cst, or may allow a current resulting from the data voltage, applied to one portion of the capacitor Cst, to flow through the organic light-emitting diode OLED while gradually discharging the data voltage.

The fifth transistor T5 is electrically connected between the second transistor T2 and the organic light-emitting diode OLED. The fifth transistor T5 may be controlled by the emission signal supplied through the gate line GL.

In a state in which the data voltage is applied to one portion of the capacitor Cst, and the driving voltage VDD, compensated for the threshold voltage, is applied to the gate node of the second transistor T2, the fifth transistor T5 may be turned on by an application of the emission signal having a turn-on level, thereby allowing the current to flow through the organic light-emitting diode OLED.

The fourth transistor T4 and the fifth transistor T5 are also referred to as emission transistors, since they control points in time at which the organic light-emitting diode OLED emits light.

The sixth transistor T6 may be electrically connected between a line, through which the reference voltage Vref is supplied, and the anode of the organic light-emitting diode OLED. The sixth transistor T6 may be controlled by the scanning signal supplied through the gate line GL.

When the scanning signal having a turn-on level is supplied through the gate line GL, the sixth transistor T6 may initialize the anode of the organic light-emitting diode OLED or the node between the second transistor T2 and the fifth transistor T5 using the reference voltage Vref.

The display driving transistors, disposed in the subpixel SP as described above, are operated by the scanning signal and the emission signal, and allow the current, resulting from the data voltage, to flow through the organic light-emitting diode OLED, so that the subpixel SP can represent levels of brightness depending on the image data.

The capacitor Cst electrically connected between the first transistor T1 and the gate electrode of the second transistor T2 serves to maintain the voltage of the gate electrode of the second transistor T2 for a one-frame period.

Thus, the capacitor Cst disposed in the subpixel SP must have at least a predetermined level of capacitance in order to drive the organic light-emitting diode OLED to emit light for the one-frame period.

Here, since the area of the subpixel SP is further reduced with increases in the resolution of the display device 100, there are a lot of difficulties in disposing the capacitor Cst having at least a predetermined level of capacitance within the subpixel SP.

Exemplary embodiments provide a solution to provide the capacitor Cst having at least a predetermined level of capacitance in the high-resolution display device 100 by increasing the capacitance per area of the capacitor Cst.

Figure 3:
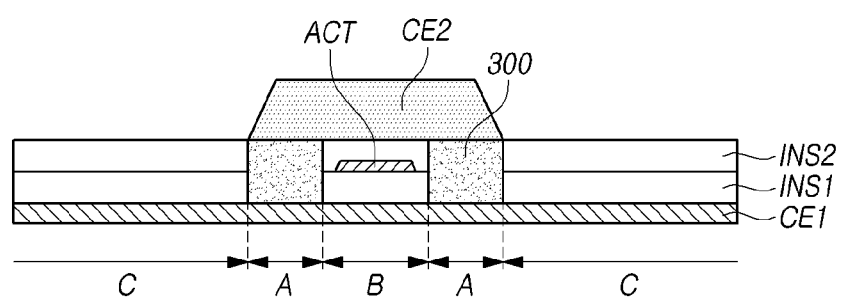
FIG. 3 illustrates a cross-sectional structure of a portion in the subpixel in the display device according to exemplary embodiments, in which the capacitor is disposed.

FIG. 3 illustrates a cross-sectional structure of a portion in the subpixel SP in the display device 100 according to exemplary embodiments, in which the capacitor Cst is disposed.

Referring to FIG. 3, a first capacitor electrode CE1 and a second capacitor electrode CE2 of the capacitor Cst may be disposed in each of the subpixels SP arrayed in the display panel 110.

The first capacitor electrode CE1 and the second capacitor electrode CE2 may be implemented using one of metal members disposed in the display panel 110. For example, the second capacitor electrode CE2 may be made of a metal member, of which a gate electrode of a transistor disposed in the subpixel SP is made of.

At least one insulating layer INS may be disposed between the first capacitor electrode CE1 and the second capacitor electrode CE2. In addition, a portion of an active layer ACT disposed in the subpixel SP may be disposed between the first capacitor electrode CE1 and the second capacitor electrode CE2. The active layer ACT may be an active semiconductor layer. In some embodiments, a transistor of the subpixel SP also includes the active layer ACT as the channel for the TFT. For example, the transistor may function as a driving transistor driving an OLED or a switching transistor in an OLED pixel.

For example, a first insulating layer INS1 may be disposed on the first capacitor electrode CE1. In addition, the active layer ACT may be disposed in a portion of an area of the first insulating layer INS1.

A second insulating layer INS2 may be disposed on the first insulating layer INS1 and the active layer ACT, and the second capacitor electrode CE2 may be disposed on the second insulating layer INS2.

Here, the first insulating layer INS1 and the second insulating layer INS2 may be made of the same material, e.g. a first-permittivity material, i.e. a material having a first permittivity. For example, the first insulating layer INS1 and the second insulating layer INS2 may be made of $SiO_2$.

In an area in which the first capacitor electrode CE1 and the second capacitor electrode CE2 overlap each other, the first insulating layer INS1 and the second insulating layer INS2 may be made of a second-permittivity material, i.e. a material having a second permittivity higher than the first permittivity.

For example, in the area in which the first capacitor electrode CE1 and the second capacitor electrode CE2 overlap each other, at least a portion of the first insulating layer INS1 and the second insulating layer INS2 may be made of SiNx.

Figure 4:
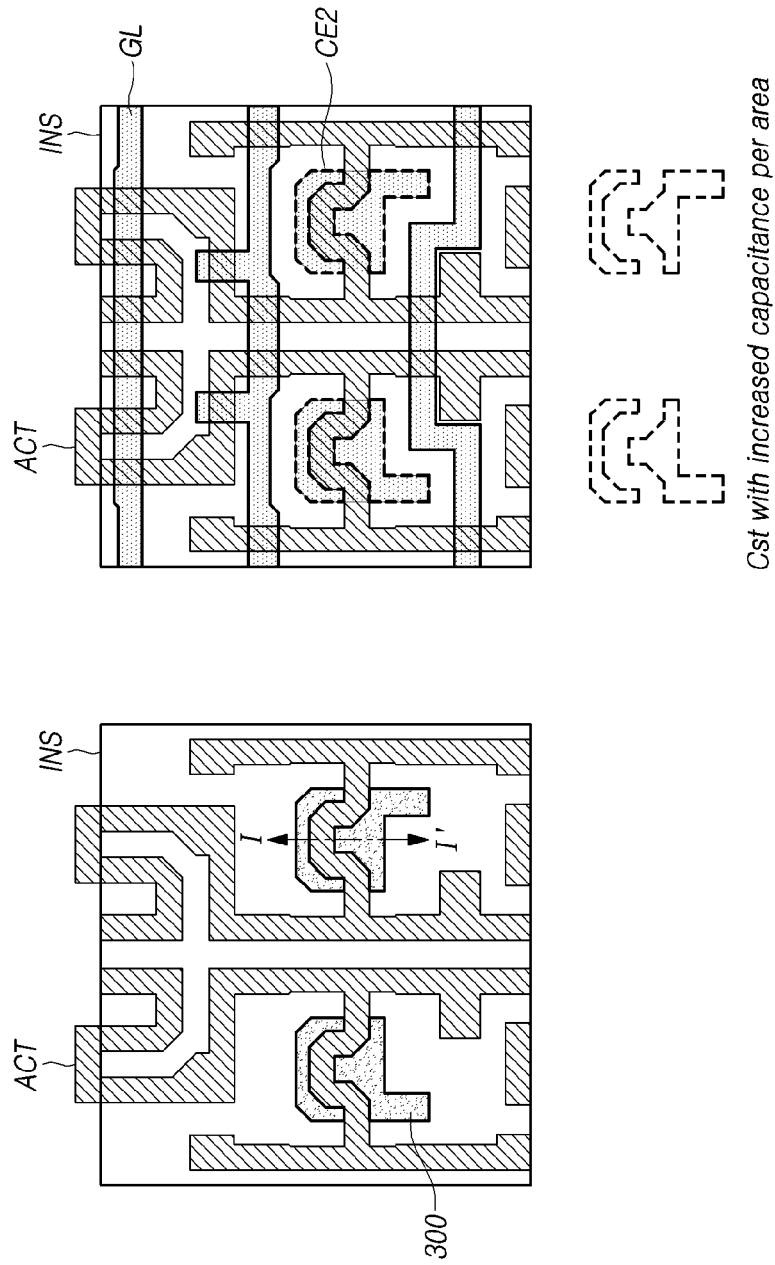
FIG. 4 illustrates a planar structure of the subpixel in the display device according to exemplary embodiments, in which the capacitor having the increased capacitance is disposed.

That is, as illustrated in FIG. 3, the portions of the first insulating layer INS1 and the second insulating layer INS2, disposed in the area between the first capacitor electrode CE1 and the second capacitor electrode CE2, except for the area in which the active layer ACT is disposed, may be made of SiNx, thereby forming a first high-permittivity portion 300 (see also FIG. 4).

In addition, portions of the first insulating layer INS1 and the second insulating layer INS2, except for the first high-permittivity portion 300, may be made of SiO2.

Thus, portions of the first insulating layer INS1 and the second insulating layer INS2 in area A may be made of a high-permittivity material, while portions of the first insulating layer INS1 and the second insulating layer INS2 in areas B and C may be made of a relatively low-permittivity material, the permittivity of which is lower than the permittivity of the material of area A.

Since the portions of the first insulating layer INS1 and the second insulating layer INS2, disposed in the area in which the first capacitor electrode CE1 and the second capacitor electrode CE2 overlap each other, are made of the high-permittivity material, the capacitance of the capacitor Cst can be increased.

In addition, since the portions of the first insulating layer INS1 and the second insulating layer INS2, except for the first high-permittivity portion 300, are made of the relatively-low-permittivity material, an increase in load in an area, except for the area in which the capacitor Cst is disposed, can be prevented.

As described above, it is possible to increase the capacitance per area of the capacitor Cst by providing the first high-permittivity portion 300 between the electrodes of the capacitor Cst disposed in the subpixel SP. In addition, a predetermined level of capacitance can be maintained, while reducing the area of the capacitor Cst, such that the capacitor Cst having a reduced area can be provided in the high-resolution display device 100.

FIG. 4 illustrates a planar structure of the subpixel SP in the display device 100 according to exemplary embodiments, in which the capacitor Cst having the increased capacitance is disposed.

Referring to FIG. 4, the insulating layer INS and the active layer ACT are illustrated as being disposed on the first capacitor electrode CE1. The insulating layer INS may be comprised of two or more insulating layers INS.

In addition, the second capacitor electrode CE2 may be disposed on the insulating layer INS, the second capacitor electrode CE2 may be made of the same metal as the gate lines GL and the like.

Here, a portion of the area of the insulating layer INS overlapping the second capacitor electrode CE2, except for the area in which the active layer ACT is disposed, may form the first high-permittivity portion 300.

That is, the portion of the insulating layer INS, disposed between the first capacitor electrode CE1 and the second capacitor electrode CE2, is made of the first-permittivity material. At least a portion of the insulating layer INS, disposed in the area in which the first capacitor electrode CE1 and the second capacitor electrode CE2 overlap each other, may be made of the second-permittivity material, the second permittivity of which is higher than the first permittivity.

Thus, the capacitance of the capacitor Cst can be increased due to the first high-permittivity portion 300 disposed in the area in which the first capacitor electrode CE1 and the second capacitor electrode CE2 overlap each other.

In addition, since the capacitance per area of the capacitor Cst is increased, it is possible to maintain a predetermined level of capacitance, while reducing the area in which the capacitor Cst is disposed.

The first high-permittivity portion 300 may be disposed in at least one insulating layer INS among the plurality of insulating layers INS disposed between the first capacitor electrode CE1 and the second capacitor electrode CE2, or may be disposed in a portion or the entire portion of the area in which the first capacitor electrode CE1 and the second capacitor electrode CE2 overlap each other, depending on the arrangement structure of the capacitor electrode CE and the active layer ACT.

Figure 5:
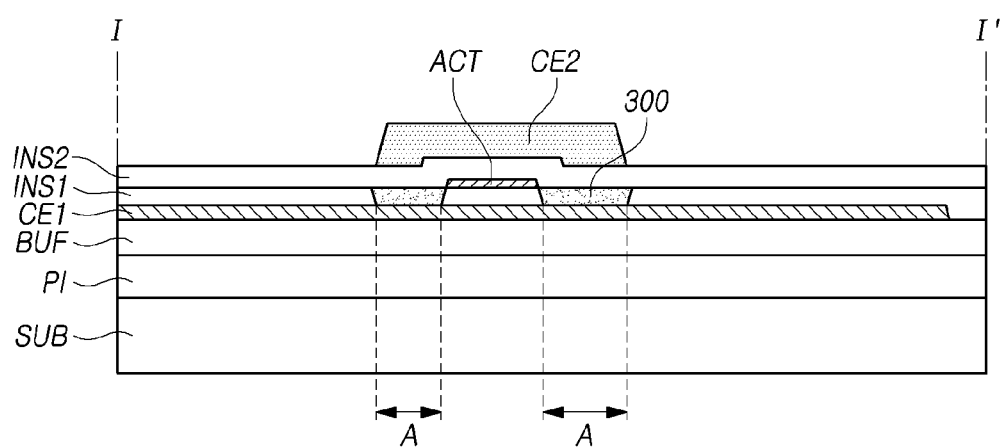
FIG. 5 illustrates a cross-sectional structure of portion I-I' of the subpixel SP illustrated in FIG. 4 according to exemplary embodiments.

FIG. 5 illustrates a cross-sectional structure of portion I-I' of the subpixel SP illustrated in FIG. 4.

Referring to FIG. 5, a polyimide layer PI may be disposed on a substrate SUB, and a buffer layer BUF may be disposed on the polyimide layer PI. Here, the polyimide layer PI may have a structure in which two or more polyimide layers PI are disposed on both sides of an insulation material.

In addition, the first capacitor electrode CE1 may be disposed on the buffer layer BUF.

The first insulating layer INS1 may be disposed on the first capacitor electrode CE1, and the active layer ACT may be disposed on a portion of the first insulating layer INS1.

The second insulating layer INS2 may be disposed on the first insulating layer INS1 and the active layer ACT, and the second capacitor electrode CE2 may be disposed on the second insulating layer INS2.

Here, a portion of the first insulating layer INS1 disposed on the first capacitor electrode CE1 may form the first high-permittivity portion 300.

For example, the first high-permittivity portion 300 may be disposed in at least a portion of the area in which the first capacitor electrode CE1 and the second capacitor electrode CE2 overlap each other, except for the area in which the active layer ACT is disposed.

Thus, in the first insulating layer INS1, disposed between the first capacitor electrode CE1 and the second capacitor electrode CE2, a portion thereof may be made of a material having the first permittivity, and another portion thereof may be made a material having the second permittivity higher than the first permittivity.

In addition, the entire portion of the second insulating layer INS2 may be made of the material having the first permittivity.

Since the portion of the first insulating layer INS1, corresponding to the area in which the first capacitor electrode CE1 and the second capacitor electrode CE2 overlap each other, includes the first high-permittivity portion 300, the capacitance of the capacitor Cst in the area A illustrated in FIG. 5 can be increased.

Alternatively, the entire portion of the first insulating layer INS1 may be made of the material having the first permittivity, while a portion of the second insulating layer INS2 may be made of the material having the second permittivity.

That is, since one of the first insulating layer INS1 and the second insulating layer INS2 disposed between the first capacitor electrode CE1 and the second capacitor electrode CE2 includes the first high-permittivity portion 300, the capacitance can be increased in the area in which the first capacitor electrode CE1 and the second capacitor electrode CE2 overlap each other.

In addition, since the portions of the first insulating layer INS1 and the second insulating layer INS2, except for the area in which the capacitor Cst is disposed, are made of the material having the first permittivity, an increase in load due to the provision of the high-permittivity material can be prevented.

The provision of the high-permittivity material only in a portion of the first insulating layer INS1 or the second insulating layer INS2 as described above may be provided by an operation of polishing and planarizing the surface of the insulating layer INS.

FIGS. 6 to 9 illustrate an exemplary fabrication process of the subpixel SP illustrated in FIG. 5.

Figure 6:
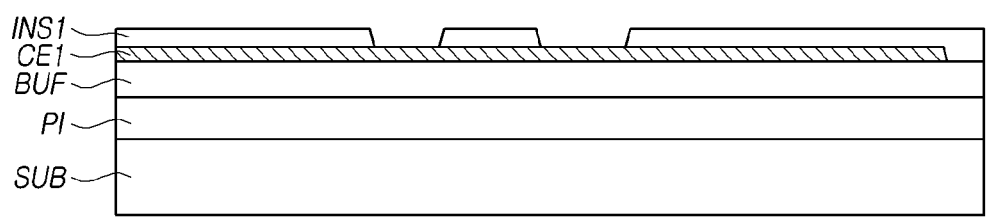
FIGS. 6 to 9 illustrate an exemplary process for the subpixel illustrated in FIG. 5.

Referring to FIG. 6, the polyimide layer PI is disposed on the substrate SUB, and the buffer layer BUF is disposed on the polyimide layer PI. In addition, the first capacitor electrode CE1 is disposed on the buffer layer BUF, and the first insulating layer INS1 is disposed on the first capacitor electrode CE1.

Here, the first insulating layer INS1 may be made of a material having the first permittivity. In addition, a portion of the first insulating layer INS1, intended to form the first high-permittivity portion 300, may be etched.

Figure 7:
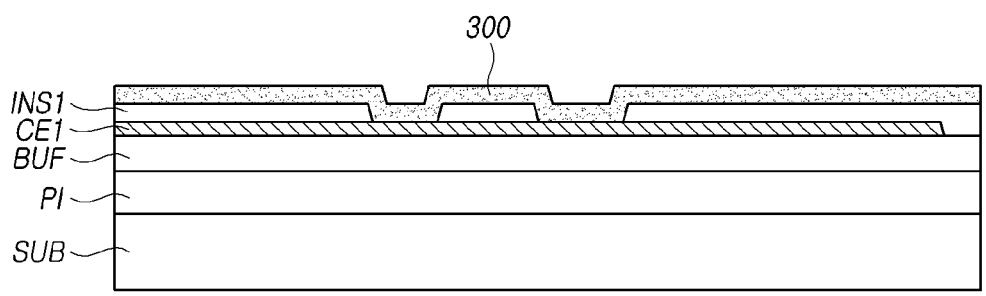

Referring to FIG. 7, a material having the second permittivity is disposed on the first insulating layer INS1.

The material having the second permittivity is disposed on the first insulating layer INS1, as well as in the etched portion of the first insulating layer INS1, through which a portion of the first capacitor electrode CE1 is exposed.

In addition, an operation of removing the material having the second permittivity disposed on the first insulating layer INS1 may be performed, so that the material having the second permittivity only remain in the etched portion of the first insulating layer INS1.

Figure 8:
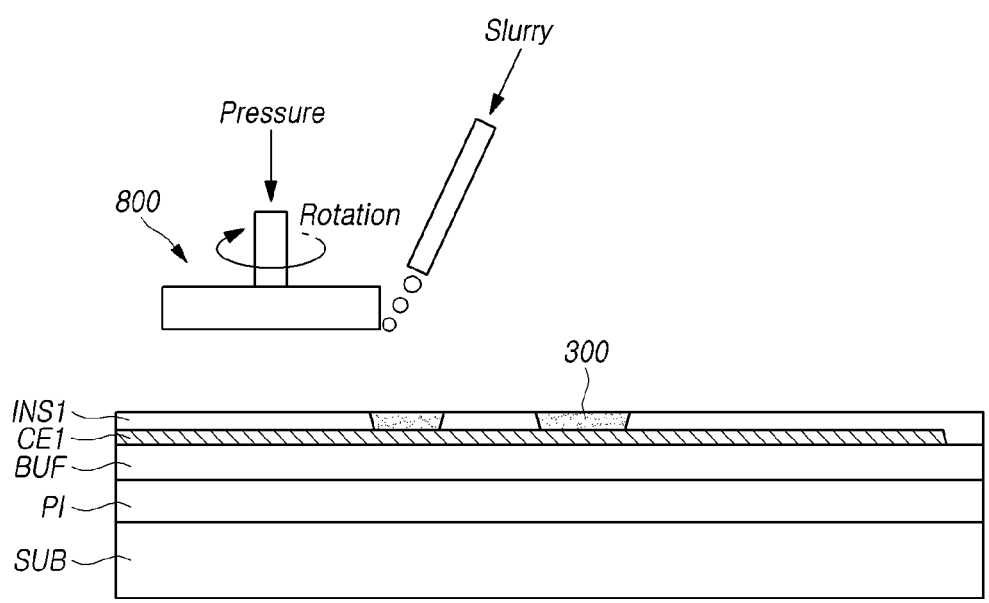

Referring to FIG. 8, after the material having the second permittivity is disposed on the first insulating layer INS1, an operation of polishing the material having the second permittivity disposed on the first insulating layer INS1 may be performed.

For example, the surface of the insulating layer INS1 may be planarized by polishing the material having the second permittivity, disposed on the first insulating layer INS1, using a polishing device 800. This polishing operation may be performed similarly to chemical mechanical polishing (CMP) in which a thin film is polished and planarized or removed by a chemical and/or physical action.

In response to the polishing of the material having the second permittivity disposed on the first insulating layer INS1, the material having the second permittivity may only be disposed in the etched portion of the first insulating layer INS1, thereby forming the first high-permittivity portion 300.

In addition, since the surface of the first insulating layer INS1 by planarized by polishing, the residue of the material having the second permittivity can be removed from the area of the first insulating layer INS1, except for the area in which the first high-permittivity portion 300 is formed. Accordingly, in any area, except for the area in which the capacitor Cst is disposed, an occurrence of parasitic capacitance or an increase in load can be prevented.

Figure 9:
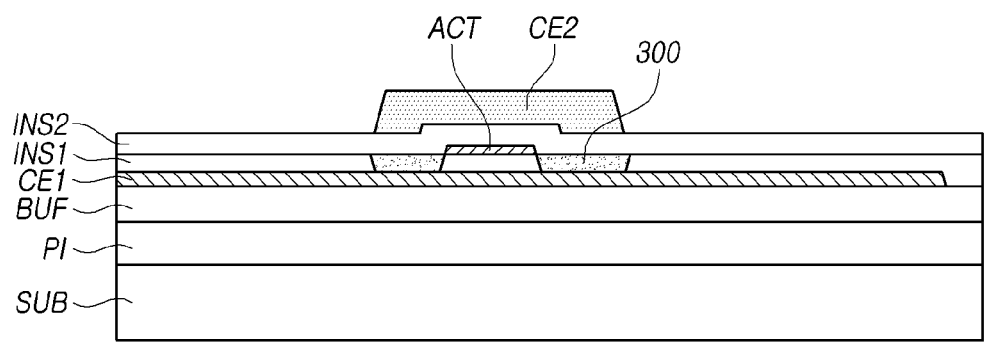

Referring to FIG. 9, the active layer ACT and the second insulating layer INS2 are disposed on the first insulating layer INS1 after the completion of the polishing. Here, the second insulating layer INS2 may be made of the material having the first permittivity.

In addition, the second capacitor electrode CE2 is disposed on the second insulating layer INS2.

Since the portion of the first insulating layer INS1, in the area in which the first capacitor electrode CE1 and the second capacitor electrode CE2 overlap each other, forms the first high-permittivity portion 300, the capacitance of the capacitor Cst can be increased.

Alternatively, when the first high-permittivity portion 300 is provided in the second insulating layer INS2, the first insulating layer INS1 is made of the first-permittivity material, and the active layer ACT is disposed on the first insulating layer INS1.

In addition, the second insulating layer INS2 is made of the first-permittivity material, and a portion of the second insulating layer INS2, in which the high-permittivity portion 300 is to be formed, is etched.

The second-permittivity material is disposed on the second insulating layer INS2, and the operation of polishing and planarizing the surface of the second insulating layer INS2 is performed, so that the first high-permittivity portion 300 is formed in the second insulating layer INS2.

That is, it is possible to increase the capacitance of the capacitor Cst by providing the first high-permittivity portion 300 in at least one insulating layer INS of the first insulating layer INS1 or the second insulating layer INS2.

In addition, in the process of fabricating the first high-permittivity portion 300, the surface of the first insulating layer INS1 or the second insulating layer INS2 is polished and planarized, so that the second-permittivity material does not remain in any area, except for the area in which the capacitor Cst is formed.

Although the first high-permittivity portion 300 may be provided in one insulating layer INS of the insulating layers INS disposed between the first capacitor electrode CE1 and the second capacitor electrode CE2 as described above, the portion in which the first high-permittivity portion 300 is to be formed may be increased by adjusting the order in which the second-permittivity material is disposed and the depth to which the insulating layer INS is etched.

Figure 10:
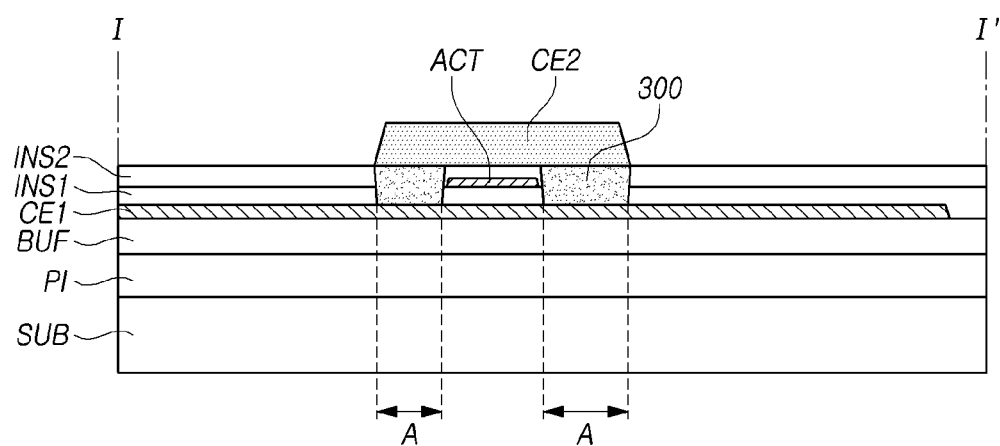
FIG. 10 illustrates a cross-sectional structure of portion I-I' of the subpixel SP illustrated in FIG. 4, according to some embodiments.

FIG. 10 illustrates a cross-sectional structure of portion I-I' of the subpixel SP illustrated in FIG. 4, according to some embodiments.

Referring to FIG. 10, the polyimide layer PI is disposed on the substrate SUB, and the buffer layer BUF is disposed on the polyimide layer PI.

The first capacitor electrode CE1 is disposed on the buffer layer BUF, and the first insulating layer INS1 is disposed on the first capacitor electrode CE1.

The active layer ACT and the second insulating layer INS2 are disposed on the first insulating layer INS1, and the second capacitor electrode CE2 is disposed on the second insulating layer INS2.

Here, the first insulating layer INS1 and the second insulating layer INS2, disposed between the first capacitor electrode CE1 and the second capacitor electrode CE2, may include the first high-permittivity portion 300 in the area in which the first capacitor electrode CE1 and the second capacitor electrode CE2 overlap each other, except for the area in which the active layer ACT is disposed.

That is, both the first insulating layer INS1 and the second insulating layer INS2, disposed between the first capacitor electrode CE1 and the second capacitor electrode CE2, may include the first high-permittivity portion. The first high-permittivity portion 300 may be disposed in contact with the top surface of the first capacitor electrode CE1 and the bottom surface of the second capacitor electrode CE2.

Since the first high-permittivity portion 300 disposed between the first capacitor electrode CE1 and the second capacitor electrode CE2 is increased in a top-bottom direction as described above, the capacitance of the capacitor Cst can further be increased.

FIGS. 11 to 14B illustrate another exemplary fabrication process of the subpixel SP illustrated in FIG. 10.

Figure 11:
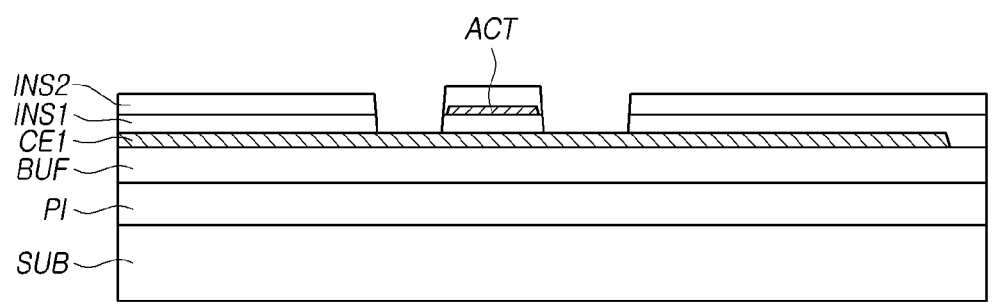
FIGS. 11, 12, 13A, 13B, 14A, and 14B illustrate an exemplary process for the subpixel illustrated in FIG. 10.

Referring to FIG. 11, the polyimide layer PI is disposed on the substrate SUB, and the buffer layer BUF is disposed on the polyimide layer PI. In addition, the first capacitor electrode CE1 is disposed on the buffer layer BUF.

The first insulating layer INS1, the active layer ACT, and the second insulating layer INS2 are disposed sequentially on the first capacitor electrode CE1, and portions of the first insulating layer INS1 and the second insulating layer INS2, in which the first high-permittivity portion 300 is to be formed, are etched.

Figure 12:
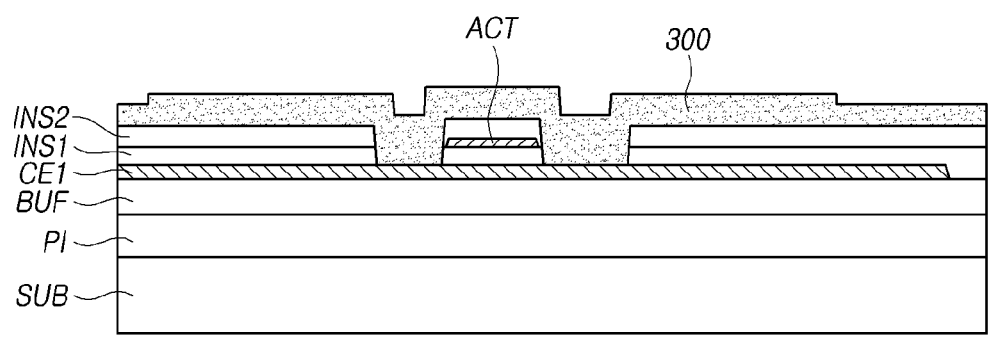

Referring to FIG. 12, after the first insulating layer INS1 and the second insulating layer INS2 are etched, the second-permittivity material is disposed on the second insulating layer INS2.

Accordingly, the second-permittivity material may be disposed on the second insulating layer INS2, as well as in the etched portions of the first insulating layer INS1 and the second insulating layer INS2, through which the first capacitor electrode CE1 is exposed.

In addition, an operation of polishing the second-permittivity material disposed on the second insulating layer INS2 may be performed, thereby forming the first high-permittivity portion 300.

The first high-permittivity portion 300 may have different shapes, depending on the operation of planarizing the surface of the second insulating layer INS2.

Figure 13A:
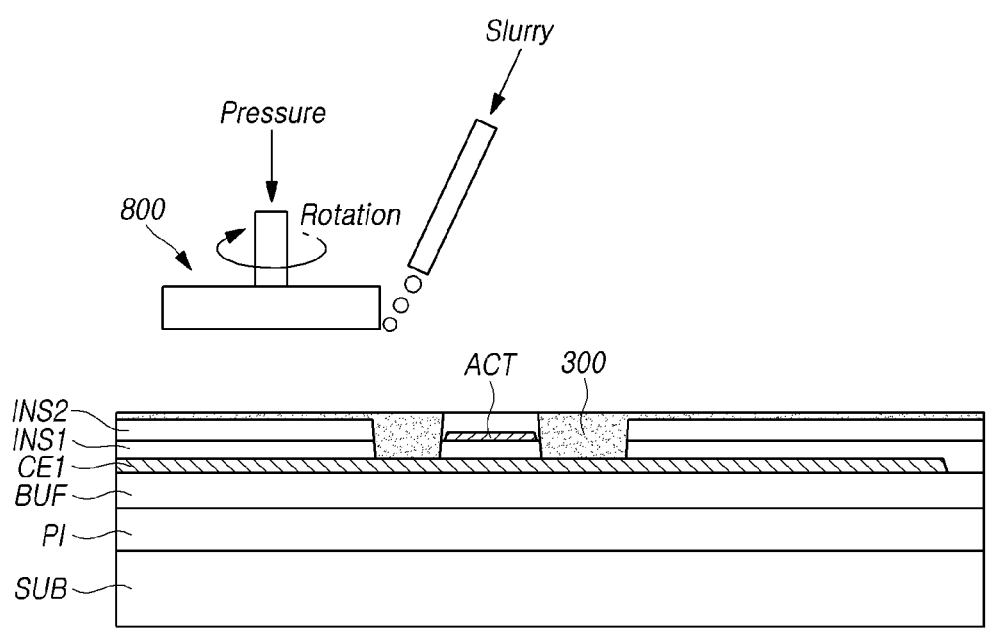
Figure 13B:
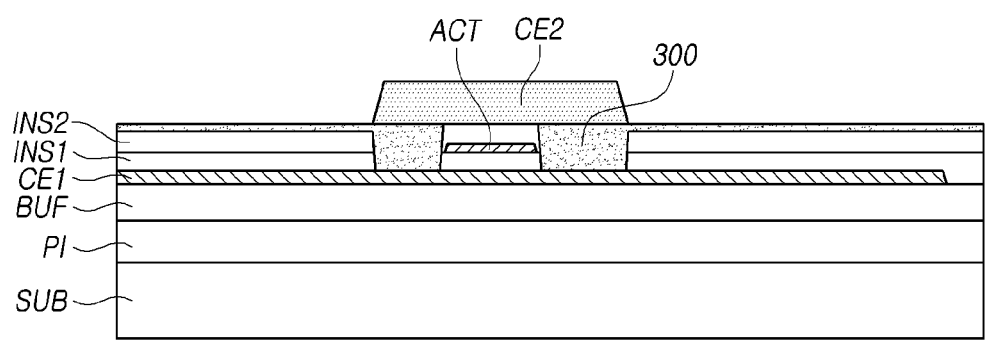

Referring to FIGS. 13A and 13B, in a case in which the surface of the second insulating layer INS2 is planarized using the polishing device 800, the polishing operation may be performed, on the basis of the second insulating layer INS2 disposed on the active layer ACT.

The portion of the second insulating layer INS2 disposed on the active layer ACT may be higher than other portions of the second insulating layer INS2 disposed in other areas, due to the active layer ACT disposed below.

Thus, when the polishing operation is performed on the basis of the second insulating layer INS2 disposed on the active layer ACT, a thin portion of the second-permittivity material may remain on the second insulating layer INS2.

In addition, the second capacitor electrode CE2 is disposed. Since the first high-permittivity portion 300 is provided in both the first insulating layer INS1 and the second insulating layer INS2, the capacitance of the capacitor Cst can be increased.

Figure 14A:
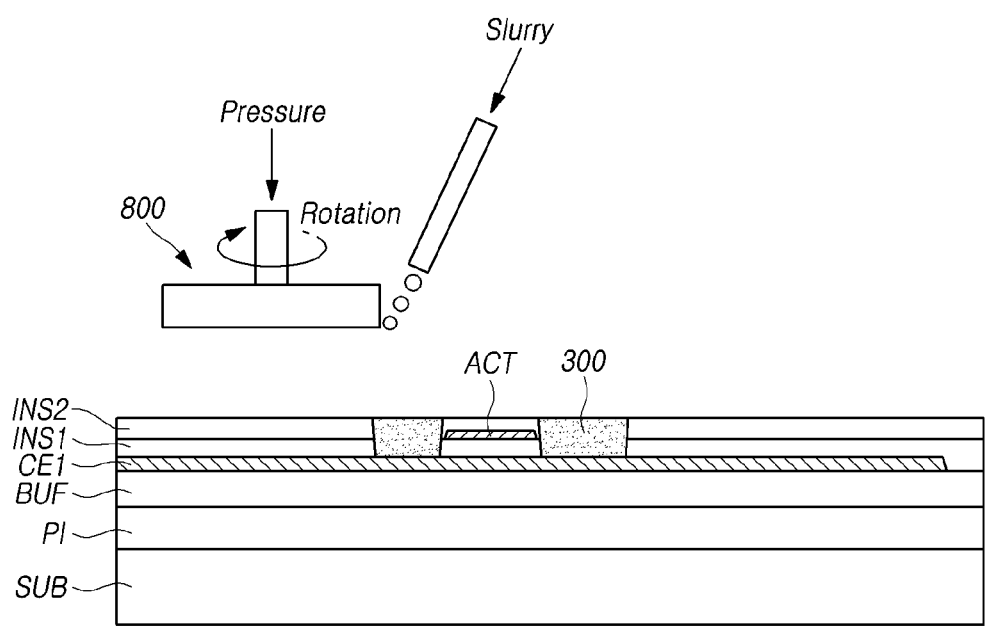
Figure 14B:
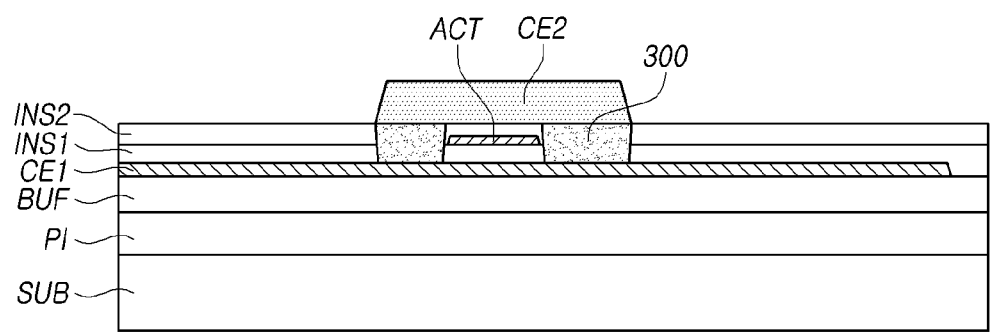

Referring to FIGS. 14A and 14B, when the surface of the second insulating layer INS2 is planarized using the polishing device 800, the polishing operation may be performed so that a top surface of the high-permittivity portion 300 is at a same height or lower than a height of the top surface of the second insulating layer INS2.

Since the polishing operation is performed such that the top surface of the high-permittivity portion is at a same height or lower than the height of the top surface of the second insulating layer INS2 disposed on the active layer ACT, the second-permittivity material only remains in the etched portions of the first insulating layer INS1 and the second insulating layer INS2.

In addition, second capacitor electrode CE2 is disposed on the second insulating layer INS2.

Since both the first insulating layer INS1 and the second insulating layer INS2 include the first high-permittivity portion 300 in the area in which the first capacitor electrode CE1 and the second capacitor electrode CE2 overlap each other, the capacitance of the capacitor Cst can further be increased.

This structure including the high-permittivity portion is applicable to the structure in which an additional capacitor electrode CE is disposed on the second capacitor electrode CE2.

Figure 15:
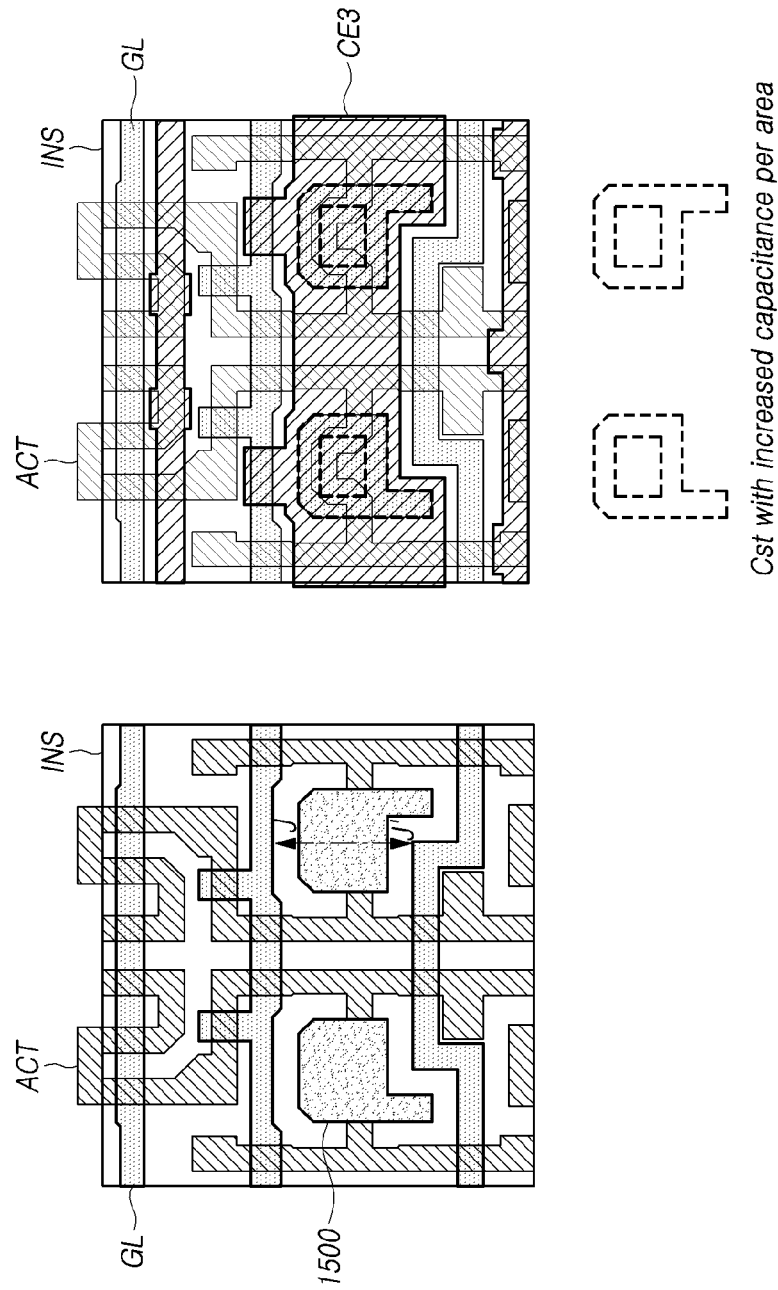
FIG. 15 illustrates a planar structure of the subpixel in the display device according to exemplary embodiments, in which the capacitor having the increased capacitance is disposed.

FIG. 15 illustrates another planar structure of the subpixel SP in the display device 100 according to exemplary embodiments, in which the capacitor Cst having the increased capacitance is disposed.

Referring to FIG. 15, a structure including a third capacitor electrode CE3 disposed on the second capacitor electrode CE2 is illustrated. A second high-permittivity portion 1500 may be disposed between the second capacitor electrode CE2 and the third capacitor electrode CE3.

That is, in this capacitor Cst structure, the third capacitor electrode CE3 for additionally generating capacitance may be disposed on the second capacitor electrode CE2. In this case, the insulating layer INS disposed between the second capacitor electrode CE2 and the third capacitor electrode CE3 may include the second high-permittivity portion 1500.

Here, the third capacitor electrode CE3 may have a contact hole, through which a signal line is connected to the second capacitor electrode CE2 disposed below.

Thus, the second high-permittivity portion 1500 disposed between the second capacitor electrode CE2 and the third capacitor electrode CE3 may also have a contact hole, the contact hole exposing the second capacitor electrode CE2. In the area, except for the portion in which the contact hole is provided, the capacitance of the capacitor Cst can be increased.

Figure 16:
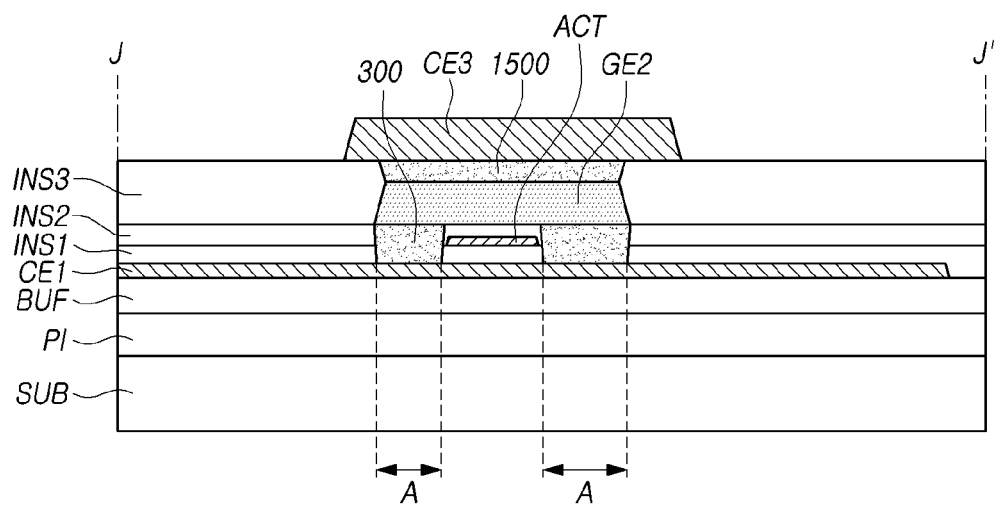
FIG. 16 illustrates a cross-sectional structure of portion J-J' of the subpixel illustrated in FIG. 15.

FIG. 16 illustrates a cross-sectional structure of portion J-J' of the subpixel SP illustrated in FIG. 15.

Referring to FIG. 16, the polyimide layer PI is disposed on the substrate SUB, and the buffer layer BUF is disposed on the polyimide layer PI. In addition, the first capacitor electrode CE1 is disposed on the buffer layer BUF.

The first insulating layer INS1, the active layer ACT, and the second insulating layer INS2 are disposed sequentially on the first capacitor electrode CE1, and the second capacitor electrode CE2 is disposed on the second insulating layer INS2.

Here, in the area in which the first capacitor electrode CE1 and the second capacitor electrode CE2 overlap each other, the first insulating layer INS1 and the second insulating layer INS2 may include the first high-permittivity portion 300.

A third insulating layer INS3 may be disposed on the second capacitor electrode CE2, and the third capacitor electrode CE3 may be disposed on the third insulating layer INS3.

Here, in the area in which the first capacitor electrode CE1 and the second capacitor electrode CE2 overlap each other, the third insulating layer INS3 may include the second high-permittivity portion 1500.

The second high-permittivity portion 1500 may be fabricated by the process of etching the third insulating layer INS3, disposing the second-permittivity material on the etched third insulating layer INS3, and polishing and planarizing the surface of the third insulating layer INS3.

Since the second high-permittivity portion 1500 is disposed below the third capacitor electrode CE3 disposed above the second capacitor electrode CE2 as described above, the capacitance of the capacitor Cst can be increased.

In addition, in some cases, only the second high-permittivity portion 1500 is disposed between the second capacitor electrode CE2 and the third capacitor electrode CE3, and both the first insulating layer INS1 and the second insulating layer INS2 are made of the first-permittivity material, such that the first high-permittivity portion 300 is not included.

That is, according to exemplary embodiments, at least a portion of the insulating layer INS disposed between the capacitor electrodes CE of the capacitor Cst is made of the high-permittivity material, and the polishing operation is performed to remove the high-permittivity material from areas, except for the capacitor Cst. The insulating layer INS in which the high-permittivity portion is formed is not limited to a specific embodiment.

FIG. 17 illustrates variations in the capacitance of the capacitor Cst in the subpixel SP provided according to exemplary embodiments.

Referring to FIG. 17, in a case in which the second-permittivity material was disposed in the insulating layer INS disposed between the first capacitor electrode CE1 and the second capacitor electrode CE2, it can be appreciated that the capacitance of the capacitor Cst was increased.

Example 1A and Example 1B indicate cases in which the first high-permittivity portion 300 is disposed only in the first insulating layer INS1, Example 2A and Example 2B indicate cases in which the first high-permittivity portion 300 is disposed in the first insulating layer INS1 and the second insulating layer INS2.

Referring to Example 1A, it can be appreciated that the capacitance thereof was increased compared to the case in which both the first insulating layer INS1 and the second insulating layer INS2 are made of $SiO_2$. Referring to Example 1B, it can be appreciated that, when the capacitance was the same in both cases, the area of the capacitor electrode CE thereof was reduced compared to the case in which both the first insulating layer INS1 and the second insulating layer INS2 are made of $SiO_2$.

In addition, referring to Example 2A and Example 2B, it can be appreciated that, in a case in which the first high-permittivity portion 300 was provided in both the first insulating layer INS1 and the second insulating layer INS2, the electrode area ratio was further reduced compared to the case having the same capacitance.

Accordingly, it is possible to provide the high-resolution display device 100 by increasing the capacitance of the capacitor Cst in the subpixel SP or reducing the area of the capacitor Cst while maintaining capacitance.

As set forth above, according to exemplary embodiments, at least a portion of the insulating layer INS disposed between the electrodes of the capacitor Cst in the subpixel is made of a high-permittivity material, such that the capacitance per area of the capacitor Cst is increased.

In addition, a high-permittivity material is disposed in the insulating layer INS, and the surface of the insulating layer INS is planarized by polishing. This makes it possible to prevent the high-permittivity material from residing in any area, except for the area in which the capacitor Cst is disposed.

Accordingly, the high-resolution display device 100 can be provided by preventing unnecessary increases in load in the subpixel and increasing the capacitance of the capacitor Cst.

The foregoing descriptions and the accompanying drawings have been presented in order to explain certain principles of the present disclosure by way of example. A person having ordinary skill in the art to which the present disclosure relates could make various modifications and variations without departing from the principle of the present disclosure. The foregoing embodiments disclosed herein shall be interpreted as being illustrative, while not being limitative, of the principle and scope of the present disclosure. It should be understood that the scope of the present disclosure shall be defined by the appended Claims and all of their equivalents fall within the scope of the present disclosure.

What is claimed is:

1. A display device comprising:
   a display panel in which a plurality of gate lines, a plurality of data lines, and a plurality of subpixels are disposed;
   a gate driver circuit driving the plurality of gate lines; and
   a data driver circuit driving the plurality of data lines,
   wherein at least one of the plurality of subpixels comprises:
   a first capacitor electrode;
   a first insulating layer disposed on the first capacitor electrode;
   an active layer disposed on a portion of the first insulating layer;
   a second insulating layer disposed on the first insulating layer and the active layer; and
   a second capacitor electrode disposed on the second insulating layer, the second capacitor electrode overlapping the first capacitor electrode in an area,
   wherein a first portion of the first insulating layer or of the second insulating layer has a first permittivity,
   a second portion of the first insulating layer or of the second insulating layer has a second permittivity, the second portion overlapping a part of the area in which the first capacitor electrode and the second capacitor electrode overlap each other, and the second permittivity is higher than the first permittivity,
   wherein a top surface of the second portion of the first insulating layer or of the second insulating layer is at a height substantially equal to a top surface of the first portion of the first insulating layer or of the second insulating layer.

2. The display device according to claim 1, wherein a portion of the active layer is disposed in the area in which the first capacitor electrode and the second capacitor electrode overlap each other, and
   at least one of the first insulating layer and the second insulating layer comprises the second portion having the second permittivity in an area separate from an area in which the active layer is disposed.

3. The display device according to claim 1, wherein the first insulating layer comprises the second portion having the second permittivity in the area in which the first capacitor electrode and the second capacitor electrode overlap each other, and
   the second insulating layer comprises the first portion having the first permittivity in the area in which the first capacitor electrode and the second capacitor electrode overlap each other.

4. The display device according to claim 1, wherein the first insulating layer comprises the first portion having the first permittivity in the area in which the first capacitor electrode and the second capacitor electrode overlap each other, and
   the second insulating layer comprises the second portion having the second permittivity in the area in which the first capacitor electrode and the second capacitor electrode overlap each other.

5. The display device according to claim 1, wherein both the first insulating layer and the second insulating layer comprise the second portion having the second permittivity, and the second portion of the first insulating layer and of the second insulating layer is in contact with a top surface of the first capacitor electrode and a bottom surface of the second capacitor electrode.

6. The display device according to claim 1, wherein the second portion having the second permittivity, in at least one of the first insulating layer and of the second insulating layer, has a flat top surface.

7. The display device according to claim 1, further comprising:
a third insulating layer disposed on the second capacitor electrode; and
a third capacitor electrode disposed on the third insulating layer,
wherein at least a portion of the third insulating layer has the first permittivity,
the third insulating layer comprises another portion having a third permittivity in an area in which the second capacitor electrode and the third capacitor electrode overlap each other, and the third permittivity is higher than the first permittivity.

8. The display device according to claim 7, wherein the third permittivity is equal to the second permittivity.

9. The display device according to claim 7, wherein the portion having the third permittivity in the third insulating layer includes a contact hole exposing the second capacitor electrode.

10. A display device comprising:
a display panel in which a plurality of gate lines, a plurality of data lines, and a plurality of subpixels are disposed;
a gate driver circuit driving the plurality of gate lines; and
a data driver circuit driving the plurality of data lines,
wherein at least one of the plurality of subpixels comprises an organic light-emitting diode, a driving transistor driving the organic light-emitting diode, and a capacitor connected to a gate node of the driving transistor, and
wherein at least a portion of an insulating layer disposed between electrodes of the capacitor has a higher permittivity than another portion of the insulating layer disposed on a same layer,
wherein a top surface of the portion of the insulating layer is at a height substantially equal to a top surface of the another portion of the insulating layer.

11. A display panel comprising:
a substrate;
a polyimide layer disposed on the substrate;
a buffer layer disposed on the polyimide layer;
a first capacitor electrode disposed on the buffer layer;
a first insulating layer disposed on the first capacitor electrode;
an active layer disposed in a portion of the first insulating layer;
a second insulating layer disposed on the first insulating layer and the active layer; and
a second capacitor electrode disposed on the second insulating layer, wherein the second capacitor electrode overlaps the first capacitor electrode in an area,
wherein a first portion of the first insulating layer or of the second insulating layer has a first permittivity,
a second portion of the first insulating layer or of the second insulating layer has a second permittivity, the second portion overlapping a part of the area in which the first capacitor electrode and the second capacitor electrode overlap each other, and the second permittivity is higher than the first permittivity,
wherein a top surface of the second portion of the first insulating layer or of the second insulating layer is at a height substantially equal to a top surface of the first portion of the first insulating layer or of the second insulating layer.

12. The display panel according to claim 11, wherein a portion of the active layer is disposed in the area in which the first capacitor electrode and the second capacitor electrode overlap each other, and
at least one of the first insulating layer and the second insulating layer comprises the second portion having the second permittivity in an area, the area of the second portion having the second permittivity separate from an area in which the active layer is disposed.

13. The display panel according to claim 11, wherein both the first insulating layer and the second insulating layer comprise the second portion having the second permittivity, and the second portion of the first insulating layer and of the second insulating layer is in contact with a top surface of the first capacitor electrode and a bottom surface of the second capacitor electrode.

14. The display panel according to claim 11, further comprising:
a third insulating layer disposed on the second capacitor electrode; and
a third capacitor electrode disposed on the third insulating layer,
wherein at least a portion of the third insulating layer has the first permittivity,
the third insulating layer comprises another portion having a third permittivity in an area in which the second capacitor electrode and the third capacitor electrode overlap each other, and the third permittivity is higher than the first permittivity.

15. The display panel according to claim 14, wherein the portion having the third permittivity in the third insulating layer has a contact hole exposing the second cathode electrode.

16. A display device comprising:
a display panel including a plurality of subpixels, each configured to emit light, at least one of the plurality of subpixels including a capacitor, the capacitor comprising:
a first electrode;
one or more insulating layers having a first permittivity and disposed on the first electrode;
an active layer;
a second electrode on the one or more insulating layers and the active layer, and
one or more insulating parts having a second permittivity and disposed between the first electrode and the second electrode, the second permittivity being greater than the first permittivity,
wherein the active layer is disposed in between the first electrode and the second electrode, and the second electrode overlaps the first electrode and the active layer,
wherein a top surface of the one or more insulating layers is at a height substantially equal to a top surface of the one or more insulating parts.

17. The display device of claim 16, wherein the active layer is positioned in a first portion of the capacitor, and the one or more insulating parts are positioned in a second portion of the capacitor separate from the first portion of the capacitor.

18. The display device of claim 16, wherein the one or more insulating parts includes a first insulating part and a second insulating part, on opposite sides of the one or more insulating layers.

19. The display device of claim 16, wherein the one or more insulating layers comprise at least a lower insulating layer and an upper insulating layer on the lower insulating layer.

20. The display device of claim 19, wherein the active layer is between the lower insulating layer and the upper insulating layer.

21. The display device of claim 20, wherein the upper insulating layer is on the one or more insulating parts and the active layer.

22. The display device of claim 20, wherein the one or more insulating parts are on the lower insulating layer.

23. The display device of claim 16, wherein the capacitor further comprises:
- another insulating part on the second electrode, the another insulating part having a third permittivity higher than the first permittivity;
- a third electrode on the another insulating part, the third electrode overlapping the second electrode.

24. The display device of claim 16, wherein the at least one of the plurality of subpixels further comprises a transistor, a part of the active layer being a channel of the transistor.

\* \* \* \* \*